(12) United States Patent
Fujiwara et al.

(10) Patent No.: US 10,225,951 B2
(45) Date of Patent: Mar. 5, 2019

(54) LIQUID IMMERSION TANK OF ELECTRONIC EQUIPMENT

(71) Applicant: FUJITSU LIMITED, Kawasaki-shi, Kanagawa (JP)

(72) Inventors: Shinnosuke Fujiwara, Kawasaki (JP); Hideo Kubo, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/616,976

(22) Filed: Jun. 8, 2017

(65) Prior Publication Data

US 2018/0020572 A1 Jan. 18, 2018

(30) Foreign Application Priority Data

Jul. 15, 2016 (JP) .................... 2016-139888

(51) Int. Cl.
H05K 7/20 (2006.01)

(52) U.S. Cl.
CPC ......... H05K 7/20272 (2013.01); H05K 7/203 (2013.01); H05K 7/20236 (2013.01)

(58) Field of Classification Search
CPC .................... H05K 7/20236; H05K 7/203
See application file for complete search history.

(56) References Cited

U.S. PATENT DOCUMENTS

| | | | | |
|---|---|---|---|---|
| 299,476 A | * | 5/1884 | Jebb | E03C 1/24 4/694 |
| 2,085,559 A | * | 6/1937 | Weber | A47K 3/02 160/327 |
| 2,405,849 A | * | 8/1946 | Riker | E03C 1/232 4/680 |
| 2,576,645 A | * | 11/1951 | Shenk | B01D 17/0208 210/305 |
| 4,051,858 A | * | 10/1977 | Mele | B08B 3/006 134/111 |
| 4,116,268 A | * | 9/1978 | Kruger | F28F 9/02 123/41.54 |
| 4,135,260 A | * | 1/1979 | Gresh | E03C 1/244 4/680 |
| 9,890,522 B2 | * | 2/2018 | Homami | E03C 1/24 |
| 10,015,905 B2 | * | 7/2018 | Watanabe | H05K 7/20236 |
| 2017/0273223 A1 | * | 9/2017 | Saito | H05K 7/20772 |

(Continued)

FOREIGN PATENT DOCUMENTS

| | | | | |
|---|---|---|---|---|
| EP | 0131661 A1 | * | 1/1985 | ............... E03C 1/24 |
| JP | 5-095064 | | 4/1993 | |

(Continued)

*Primary Examiner* — Robert J Hoffberg
(74) *Attorney, Agent, or Firm* — Fujitsu Patent Center

(57) ABSTRACT

The present application discloses a liquid immersion tank of an electronic equipment, which restrains a gas from being mixed in a circulation path even when an outflow port to a circulation path exists in the vicinity of a liquid surface. The liquid immersion tank of the electronic equipment, which is disclosed in the present application, includes a tank body being receivable of the electronic equipment and being connected to the circulation path of a coolant for liquid-cooling the electronic equipment by being immersed in the liquid coolant, and an enclosure including inside an outflow port to the circulation path and receiving an inflow of the coolant overflowing from a liquid surface in the tank body.

4 Claims, 6 Drawing Sheets

(56) References Cited

U.S. PATENT DOCUMENTS

| | | | |
|---|---|---|---|
| 2017/0280587 A1* | 9/2017 | Watanabe | H05K 7/20272 |
| 2017/0332514 A1* | 11/2017 | Saito | H05K 7/20236 |
| 2017/0354061 A1* | 12/2017 | Saito | H05K 7/20236 |
| 2018/0020571 A1* | 1/2018 | Saito | H05K 7/20236 |
| 2018/0084670 A1* | 3/2018 | Hirai | H05K 7/20236 |
| 2018/0246550 A1* | 8/2018 | Inaba | G06F 1/20 |

FOREIGN PATENT DOCUMENTS

| | | | |
|---|---|---|---|
| JP | 5-95064 A | 4/1993 | |
| JP | 2012-15280 A | 1/2012 | |
| JP | 2013-45942 A | 3/2013 | |
| JP | 2014-219151 A | 11/2014 | |
| JP | 2016-046431 | 4/2016 | |
| WO | WO 2016088280 A1 * | 6/2016 | F25D 9/00 |

\* cited by examiner

LIQUID IMMERSION TANK OF ELECTRONIC EQUIPMENT

CROSS-REFERENCE TO RELATED APPLICATION

This application is based upon and claims the benefit of priority of the prior Japanese Patent Application No. 2016-139888, filed on Jul. 15, 2016, the entire contents of which are incorporated herein by reference.

FIELD

The present application pertains to a liquid immersion tank of an electronic equipment.

BACKGROUND

A variety of cooling mechanisms are used for electronic equipments (refer to, e.g., Patent Documents 1 and 2).

PATENT DOCUMENT

[Patent Document 1] Japanese Laid-open Patent Publication No. 2016-46431
[Patent Document 2] Japanese Laid-open Patent Publication No. 05 (1993)-95064

SUMMARY

A liquid immersion tank of an electronic equipment, which is disclosed in the present application, includes: a tank body being receivable of an electronic equipment and being connected to a circulation path of a coolant for liquid-cooling the electronic equipment by being immersed in the liquid coolant; and an enclosure including inside an outflow port to the circulation path and receiving an inflow of the coolant overflowing from a liquid surface in the tank body.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

An embodiment will hereinafter be described. The embodiment to be illustrated below is a mere exemplification, and a technical scope of the present disclosure is not limited to the following mode.

Figure 1:
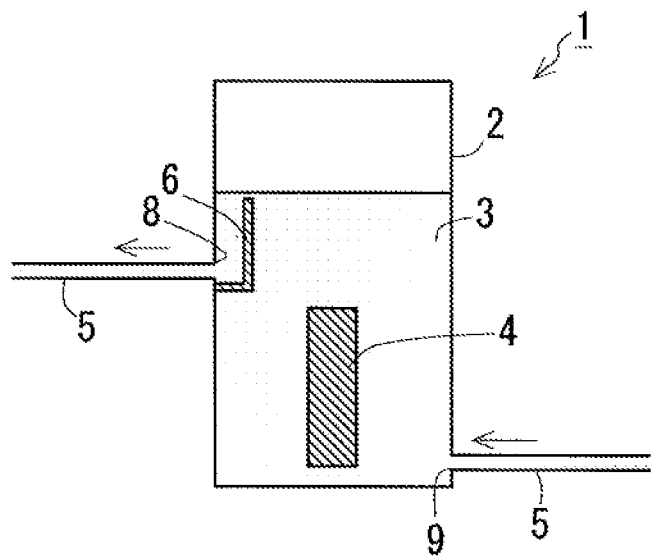
FIG. 1 is a view depicting one example of a liquid immersion tank of an electronic equipment according to an embodiment.

FIG. 1 is a view depicting one example of a liquid immersion tank of an electronic equipment according to the embodiment. A liquid immersion tank 1 includes a tank body 2 containing a liquid coolant 3. The tank body 2 receives an electronic equipment 4 immersed in the liquid coolant 3. The electronic equipment 4 is an electronic equipment that is preferable to be cooled during an operation. The electronic equipment 4 is applicable to servers, databases, communication equipments, electronic equipments for medical treatments and for various types of experimental equipments, and a variety of other electronic equipments. A circulation path 5 for forcibly circulating the coolant 3 inside and outside of the tank body 2 by a pump is connected to the tank body 2.

The liquid immersion tank 1 is a liquid cooling type of cooling mechanism not based on a premise that the coolant is boiled. The liquid immersion tank 1 is also a mechanism configured so that a heat removing means provided midway of the circulation path 5 removes heat as the coolant 3 remains in a liquid phase. Hence, an inflow port 9 and an outflow port 8, which exist at a connecting portion between the tank body 2 and the circulation path 5, are each provided in positions lower than a liquid surface of the coolant 3 within the tank body 2 in order to circulate the coolant 3 remaining in the liquid state inside and outside the tank body 2. The liquid coolant 3 accumulated in the tank body 2 normally has a higher temperature on an upper side than a lower side. Therefore, in the liquid immersion tank 1 according to the embodiment, a lower portion of the tank body 2 is provided with the inflow port 9 receiving an inflow of the coolant 3 from the circulation path 5 to the tank body 2, and a vicinity of the liquid surface in an upper portion of the tank body 2 is provided with the outflow port 8 receiving an outflow of the coolant 3 from the tank body 2 to the circulation path 5 so that the heat of the electronic equipment 4 is efficiently removed by the coolant 3.

The outflow port 8 exists in the vicinity of the liquid surface in the upper portion of the tank body 2, in which case the heat can be transferred more efficiently than existing in the lower portion of the tank body 2. However, the coolant 3 leaks from the tank body 2 due to evaporation, evaporates and loses when a maintenance work is conducted, and expands and contracts depending on a quantity of the heat emitted by the electronic equipment 4, and hence an internal liquid level of the tank body 2 is not fixed. Accordingly, when the outflow port 8 toward the circulation path 5 is disposed in the vicinity of the liquid surface within the tank body 2, such a possibility exists that a gas is mixed in the circulation path 5 based on the premise that the liquid coolant 3 is circulated, due to variations of the liquid level, fluctuations of the liquid surface and other equivalent factors. When the gas is mixed in the circulation path 5 based on the premise that the liquid coolant 3 is circulated, there are caused a fault of the pump, an increase in pressure loss of the circulation path and other equivalent phenomena, thereby leading to a decrease in cooling capability. Such being the case, a pit-like pocket 6 (which is one example of an "enclosure" according to the present application), into which the coolant 3 overflowed from the liquid surface within the tank body 2 flows, is provided in an internal wall surface of the tank body 2. The pocket 6 is provided in the vicinity of the liquid surface of the coolant 3 within the tank body 2.

Figure 2:
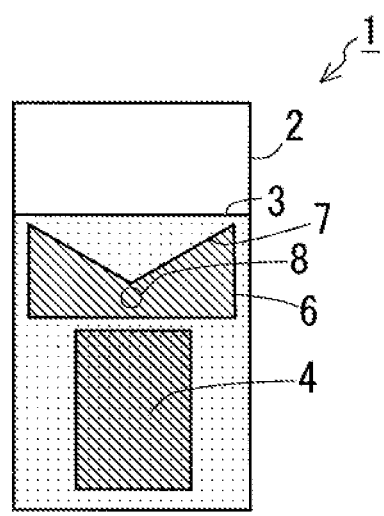
FIG. 2 is a view illustrating a slit of a pocket.
Figure 3:
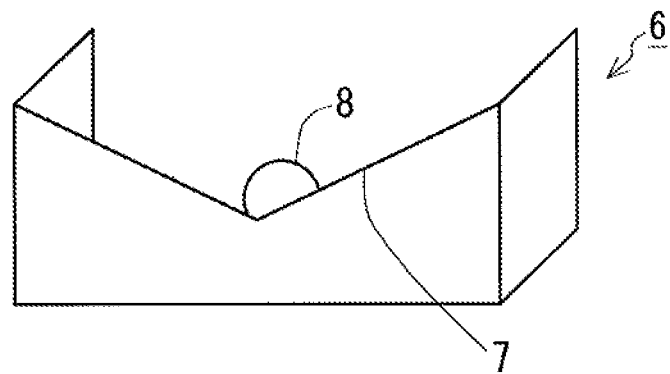
FIG. 3 is a view illustrating a positional relation between an outflow port existing inside the pocket and the pocket.

FIG. 2 is a view illustrating a slit 7 of the pocket 6. FIG. 3 is a view illustrating a positional relation between the outflow port 8 existing inside the pocket 6 and the pocket 6. An opening portion of the pocket 6 is formed with the slit 7 as depicted in FIG. 2. The slit 7 takes an inverted triangle to reduce an effective width to a greater degree from the upper side to the lower side of the tank body 2. The pocket 6 is configured to surround the outflow port 8 within the tank body 2, and has a box-like form with its upper portion being opened. When the liquid level of the coolant 3 in the tank body 2 reaches the opening of the pocket 6, the coolant 3 overflowed from the liquid surface of the tank body 2 flows into an interior of the pocket 6.

Figure 4:
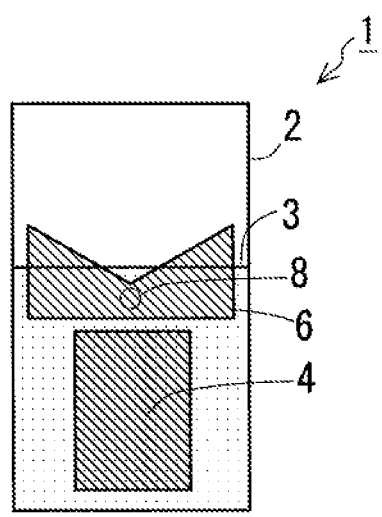
FIG. 4 is a view illustrating a state in which a liquid level of a coolant in the tank body is in the middle of the slit.

FIG. 4 is a view illustrating a state in which the liquid level of the coolant 3 in the tank body 2 is in the middle of the slit 7. Mainly the coolant 3 is discharged from the upper opening portion when the liquid level in the tank body 2 is higher than a position of the pocket 6, and is discharged from the slit 7 when the liquid level in the tank body 2 is in the middle of the slit 7.

Even when the outflow port 8 is disposed in the vicinity of the liquid surface in order to efficiently cool the electronic equipment 4, the coolant 3 is discharged in the position invariably higher than the outflow port 8, resulting in a low possibility that the gas instanced by the air is mixed in the circulation path 5.

The liquid immersion tank 1 according to the embodiment has no apprehension of overheating the electronic equipment 4 due to the accumulation of the high-temperature coolant 3 in the tank body 2 owing to the discharge, from the outflow port 8, of the coolant 3 existing in the vicinity of the liquid surface having a relatively high temperature in the entire coolant 3 within the tank body 2. In other words, the electronic equipment 4 is efficiently cooled.

Note that the liquid immersion tank 1 may be modified, e.g., as follows.

Figure 5:
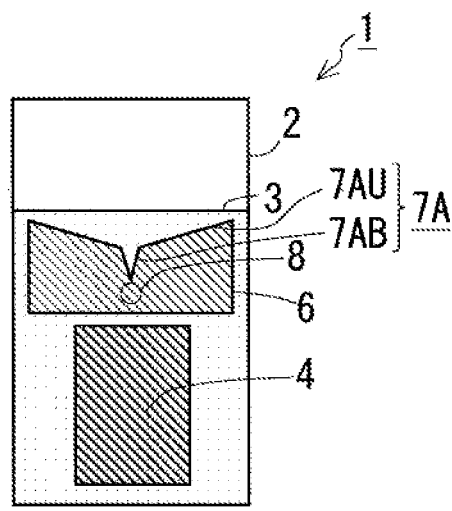
FIG. 5 is a view depicting a first modified example of the liquid immersion tank.

FIG. 5 is a view depicting a first modified example of the liquid immersion tank 1. The first modified example is that a variation of a breadth of a slit 7A is not fixed from upward to downward as in the case of the slit 7 but changes on the midway. The slit 7A has the larger variation of the breadth on the upper side of the slit 7A than the variation of the breadth on the lower side thereof. To be specific, a decreasing rate of an effective width due to the lowered liquid level is large in an upper slit portion 7AU forming the upper side of the slit 7A, while the decreasing rate of the effective width due to the lowered liquid level is small in a lower slit portion 7AB forming the lower side of the slit 7A. In the liquid immersion tank 1 according to the first modified example including the slit 7A with the effective width changing stepwise, when the liquid level within the tank body 2 starts lowering, an outflow quantity of the coolant 3 flowing out of the outflow port 8 promptly decreases, and hence the liquid level within the tank body 2 is promptly recovered. Such a possibility therefore decreases that the gas instanced by the air is mixed in the circulation path 5.

Figure 6:
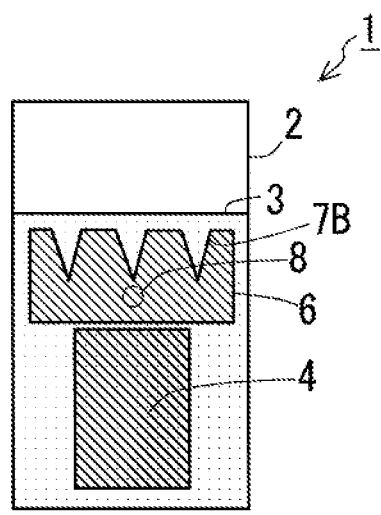
FIG. 6 is a view depicting a second modified example of the liquid immersion tank.

FIG. 6 is a view illustrating a second modified example of the liquid immersion tank 1. In the second modified example, the pocket 6 is provided with a plurality of slits 7B each smaller than the slit 7. In the second modified example including the plurality of relatively small slits 7B, the coolant 3 flows in the pocket 6 from a plurality of portions of the liquid surface, and therefore the high-temperature coolant 3 is easier to flow in the pocket 6 than in the embodiment including one relatively large slit 7. The relatively high temperature coolant 3 existing in the vicinity of the liquid surface within the tank body 2 can be uniformly flowed in the pocket 6 even when the tank body 2 has a relatively large capacity and even when the tank body 2 receives a plurality of electronic equipments 4.

Figure 7:
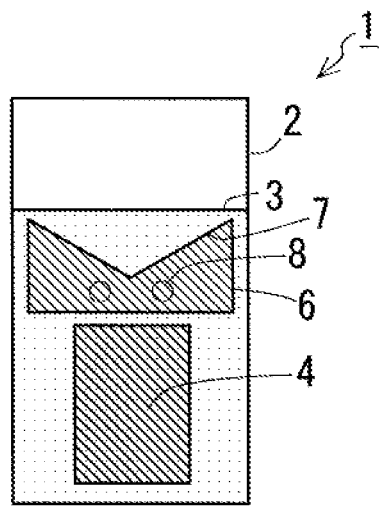
FIG. 7 is a view depicting a third modified example of the liquid immersion tank.

FIG. 7 is a view illustrating a third modified example of the liquid immersion tank 1. In the third modified example, a plurality of outflow ports 8 is provided within the pocket 6. When the plurality of outflow ports 8 exists within the pocket 6, a circulation quantity of the coolant 3 can be made larger than by providing one outflow port 8.

Figure 8:
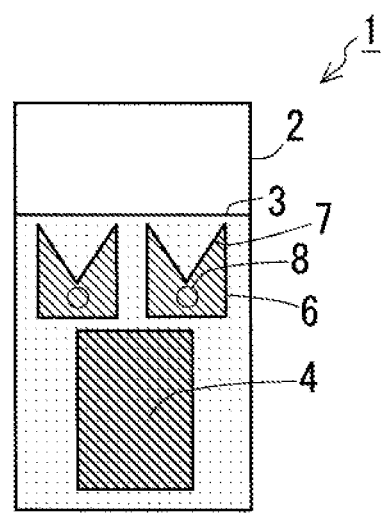
FIG. 8 is a view depicting a fourth modified example of the liquid immersion tank.

FIG. 8 is a view illustrating a fourth modified example of the liquid immersion tank 1. In the fourth modified example, there is provided a plurality of pockets 6 each having the outflow port 8 inside. When the plurality of pockets 6 exists in the tank body 2, similarly to the second modified example, the relatively high temperature coolant 3 existing in the vicinity of the liquid surface within the tank body 2 can be uniformly flowed in the pockets 6. Further, similarly to the third modified example, the circulation quantity of the coolant 3 can be increased.

Figure 9:
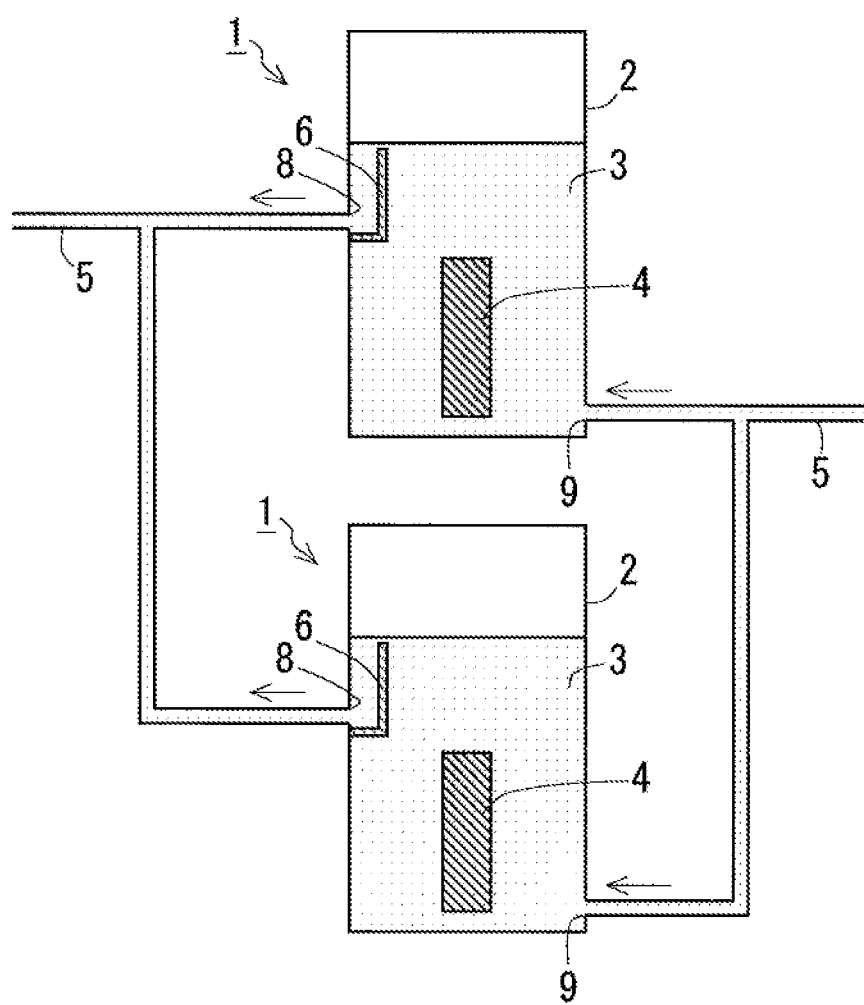
FIG. 9 is a view depicting an applied example of the liquid immersion tank.

FIG. 9 is a view illustrating an applied example of the liquid immersion tank 1. A plurality of liquid immersion tanks 1 according to the embodiment and the modified examples can be, as depicted in FIG. 9, provided in parallel in the middle of the circulation path 5. Owing to the slit 7 with the effective width being reduced toward the lower side from the upper side of the tank body 2, there increase the quantity of the coolant 3 overflowing from the liquid surface of the tank body 2 and flowing in the pocket 6 upon a rise in the liquid level in the tank body 2 and the quantity of coolant 3 flowing to the circulation path 5 from the outflow port 8. When the liquid level in the tank body 2 is lowered, there decrease the quantity of the coolant 3 overflowing from the liquid surface in the tank body 2 and flowing in the pocket 6 and the quantity of the coolant 3 flowing in the circulation path 5 from the outflow port 8. When there increases the quantity of the coolant 3 flowing in the circulation path 5 from the outflow port 8 upon the rise in the liquid level in the tank body 2, the liquid level in the tank body 2 is gradually lowered. When there decreases the quantity of the coolant 3 flowing in the circulation path 5 from the outflow port 8 upon the lowering in the liquid level in the tank body 2, the liquid level in the tank body 2 gradually rises. In the liquid immersion tank 1 according to the embodiment, the pocket 6 provided inside with the outflow port 8 of the tank body 2 is formed with the slit 7 for increasing and decreasing the outflow quantity of the coolant 3 corresponding to the liquid level in the tank body 2. The liquid level is thereby raised while restraining the outflow quantity when the liquid level in the tank body 2 tends to be lowered. For example, when the two liquid immersion tanks 1 are provided in parallel in the middle of the circulation path 5, the liquid level is lowered after the liquid level in one liquid immersion tank 1 rises to increase the outflow quantity of the coolant 3, and the liquid level rises after the liquid level in the other liquid immersion tank 1 is lowered to decrease the outflow quantity of the coolant 3. Therefore, the liquid level in each liquid immersion tank 1 is kept substantially constant, and such a possibility decreases that the gas is mixed in the circulation path 5 from the outflow port 8 of each liquid immersion tank 1.

Effects of the applied example illustrated in FIG. were verified by an experiment, and results of the verification are given as below. In the verification, the two liquid immersion tanks each having a capacity of 190 L were provided in parallel in the middle of the circulation path, each liquid immersion tank contained the coolant of 170 L, and the coolant was circulated at a total circulation rate of 80 L/min. In the case of the liquid immersion tank having no pocket, it was less than 2 minutes before the coolant overflowed from one of the two liquid immersion tanks since the circulation of the coolant had started. On the other hand, in the case of the liquid immersion tank having the pocket, the coolant did not overflow from the liquid immersion tank.

Note that the embodiment is not limited to the mode of providing the two liquid immersion tanks 1 in parallel. One liquid immersion tank 1 may be provided in the circulation path 5, and three or more liquid immersion tanks 1 may also be provided therein.

Figure 10:
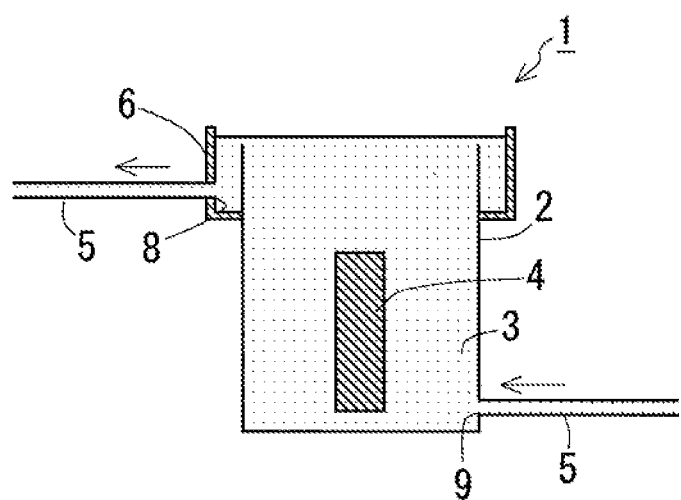
FIG. 10 is a view depicting still another modified example of the liquid immersion tank.

FIG. 10 is a view illustrating still another modified example of the liquid immersion tank 1. The liquid immersion tank 1 according to the embodiment and the modified examples include the outflow port 8 provided inside the tank body 2. However, in the liquid immersion tank 1, e.g., as illustrated in FIG. 10, a pocket 6S may be formed outside the tank body 2 in a way that surrounds the opening of the upper portion of the tank body 2, and the outflow port 8 may be provided in the pocket 6S.

In the electronic equipment instanced by a server installed at a data center, there are increased an integration density of an integrated circuit to be mounted and a packaging density of electronic components, and a data size to be processed augments. For these reasons, a heat generation rate of the electronic equipment continues to rise, and it is desired to actually attain an efficient cooling technology. A method of cooling the electronic equipment is exemplified by a forced-air cooling method using a cooling fan that has been employed for many years and, in addition, a liquid immersion cooling method of immersing the electronic equipment in liquid coolants that has accelerated its development in recent years.

A liquid accumulated in a tank normally has a higher temperature on an upper side than on a lower side. The same is applied to a liquid coolant in which the electronic equipment is immersed. Accordingly, the electronic equipment is immersed in the liquid coolant within a liquid immersion tank, and a circulation path for circulating the coolant in the liquid immersion tank is provided outside the liquid immersion tank, in which case the coolant can efficiently transfer heat when flowing to the circulation path from the vicinity of a liquid surface within the liquid immersion tank. However, the coolant leaks from the liquid immersion tank due to evaporation, evaporates and loses when a maintenance work is conducted, and expands and contracts depending on a quantity of the heat emitted by the electronic equipment, and hence a liquid level within the liquid immersion tank is not fixed. Hence, even when an outflow port to the circulation path is disposed in the vicinity of the liquid surface, such a possibility exists that the gas is mixed in the circulation path of the liquid due to variations of the liquid level, fluctuations of the liquid surface and other equivalent factors. When the gas is mixed in the circulation path of the liquid, there are caused a fault of a pump, an increase in pressure loss of the circulation path and other equivalent phenomena, thereby leading to a decrease in cooling capability.

Under such circumstances, the present application discloses a liquid immersion tank of an electronic equipment, which restrains a gas from being mixed in a circulation path even when an outflow port to a circulation path exists in the vicinity of a liquid surface.

The liquid immersion tank is capable of restraining a gas from being mixed in the circulation path even when the outflow port to the circulation path exists in the vicinity of the liquid surface.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A liquid immersion tank of an electronic equipment, comprising:
    a tank body being receivable of the electronic equipment and being connected to a circulation path of a liquid coolant for liquid-cooling the electronic equipment by being immersed in the liquid coolant; and
    an enclosure including inside an outflow port to the circulation path and receiving an inflow of the liquid coolant overflowing from a liquid surface in the tank body,
    the enclosure includes a slit receiving a passage of the liquid coolant from the liquid surface in the liquid immersion tank and an effective width of the slit reduces toward a lower side from an upper side of the tank body and the effective width of the slit changes stepwise toward the lower side from the upper side of the tank body.

2. The liquid immersion tank of the electronic equipment according to claim 1, wherein the enclosure has a plurality of slits that constitute the slit.

3. The liquid immersion tank of the electronic equipment according to claim 1, wherein the enclosure is provided inside the tank body.

4. The liquid immersion tank of the electronic equipment according to claim 2, wherein the enclosure is provided inside the tank body.

* * * * *